United States Patent
Shan et al.

(10) Patent No.: US 12,113,497 B2
(45) Date of Patent: Oct. 8, 2024

(54) DUAL MODE POWER CONTROL CIRCUITS FOR RF TRANSMITTERS

(71) Applicant: HUGHES NETWORK SYSTEMS, LLC, Germantown, MD (US)

(72) Inventors: Minheng Shan, Rockville, MD (US); Kumudchandra Shantilal Patel, Clarksburg, MD (US)

(73) Assignee: HUGHES NETWORK SYSTEMS, LLC, Germantown, MD (US)

( * ) Notice: Subject to any disclaimer, the term of this patent is extended or adjusted under 35 U.S.C. 154(b) by 0 days.

(21) Appl. No.: 18/170,261

(22) Filed: Feb. 16, 2023

(65) Prior Publication Data
US 2024/0283418 A1     Aug. 22, 2024

(51) Int. Cl.
*H03G 3/30*     (2006.01)

(52) U.S. Cl.
CPC ......... *H03G 3/3068* (2013.01); *H03G 3/3036* (2013.01)

(58) Field of Classification Search
CPC ............................ H03G 3/3068; H03G 3/3036
See application file for complete search history.

(56) References Cited

U.S. PATENT DOCUMENTS

| | | | | |
|---|---|---|---|---|
| 6,242,982 B1* | 6/2001 | Ibelings | ............... | H03G 3/3042 455/200.1 |
| 2003/0179040 A1* | 9/2003 | Kossor | ................. | H03G 3/3042 330/136 |
| 2006/0006940 A1* | 1/2006 | Hu | ....................... | H03G 1/0088 330/129 |
| 2009/0191834 A1* | 7/2009 | Barber | ............... | G01R 31/2841 455/313 |

FOREIGN PATENT DOCUMENTS

JP     2003289229 A     10/2003

OTHER PUBLICATIONS

International Search Report and Written Opinion issued May 6, 2024 in corresponding PCT/US2024/015472.

* cited by examiner

*Primary Examiner* — Freshteh N Aghdam
(74) *Attorney, Agent, or Firm* — NovoTechIP International PLLC

(57) ABSTRACT

A dual-mode switchable power control circuit for an RF transmit signal path of an RF transmitter is switchable between an open-loop automatic gain control (AGC) mode and a closed-loop automatic level control (ALC) mode in the analog domain to provide power control for the RF transmit signal path. The open-loop AGC mode and the closed-loop ALC mode are both controlled based on the analog control signal on the same control line. In the open-loop AGC mode, the analog control signal corresponds to the AGC control voltage indicating a setpoint gain for the RF transmit signal path. In the closed-loop ALC mode, the analog control signal corresponds to an ALC reference voltage indicating a setpoint power output level for the RF transmit signal path.

20 Claims, 8 Drawing Sheets

DUAL MODE POWER CONTROL CIRCUITS FOR RF TRANSMITTERS

TECHNICAL FIELD

The disclosure is directed generally to radio frequency (RF) transmission devices, and, in particular, to power control circuits for RF transmission devices.

BACKGROUND

RF transmitters of wireless communication systems have an RF signal path, or chain, configured to generate and transmit RF signals. RF signal paths for wireless transmitters typically include a signal source (such as a modulator), a gain control device (such as an attenuator), one or more power amplifiers for power amplification and/or driving an antenna. RF signal paths are designed to generate and transmit RF signals having a desired power output level. However, due to various factors, such as changes in temperature, component selection and tolerances, frequency changes, and the like, the performance of the electronic components that make up the RF signal path can vary which in turn can cause the actual output power of the RF signal path to deviate from the desired power output level.

Power control schemes have been developed for RF signal paths to account for variations in the performance of the components of the RF signal path and to ensure a stable, constant and controllable output power for the RF signal path. Examples of such power control schemes include automatic gain control (AGC) schemes and automatic level control (ALC) schemes. AGC schemes typically involve generating a variable AGC control voltage that adjusts the gain of the RF signal path to achieve a desired output power level. ALC schemes typically involve generating a ALC reference voltage indicating the desired output power of the RF signal path and adjusting the gain to achieve the desired output power. In either case, the control schemes may be implemented as closed-loops or open-loops depending on whether the output power levels are detected (or a parameter indicative of the output power level) and used as feedback for adjusting the gain of the RF signal path.

Previously known communication systems typically implemented either a closed-loop power control scheme or an open-loop power control schemes (whether AGC or ALC) for RF transmit signal paths depending on the specific application which involves designing and manufacturing different circuits depending on whether closed-loop or open-loop control was being implemented. While effective, using separate circuits for implementing closed-loop and open-loop control means that if a change in power control scheme for an RF transmitter is desired, the RF transmitter or components of the RF transmitter may have to be replaced and/modified.

What is needed is a power control circuit for an RF transmit signal path that enables the power control scheme of the RF transmit signal path to be easily switched between closed-loop and open loop control without requiring modification of the device or components of the transmitter.

SUMMARY

In one general aspect, the instant disclosure presents a transmission device for a communication system that includes a radio frequency (RF) signal path having a signal source configured to generate an RF signal. The RF signal path also includes a dual-mode analog variable gain attenuator (AVGA) electrically coupled to receive (i) the RF signal, (ii) an attenuation control signal, and (iii) a mode signal. The dual-mode AVGA is configured to attenuate the RF signal based on an attenuation value indicated by the attenuation control signal. The mode signal indicates a control mode to be used by the dual-mode AVGA to determine the attenuation value based on the attenuation control signal. An RF directional coupler is electrically coupled to receive the RF signal from the dual-mode AVGA and to output an output RF signal and a coupled RF signal. The coupled RF signal is indicative of the output RF. A power control circuit includes a power detector electrically coupled to receive (i) the coupled RF signal and (ii) a setpoint voltage signal and to generate a detector output signal based on the coupled RF signal and the setpoint voltage signal. The power control circuit also includes a switch circuit electrically coupled to receive (i) the mode control signal, (ii) the detector output signal, and (iii) a voltage control signal. The mode signal has one of a first value indicating an open-loop automatic gain control (AGC) mode of operation for the power control circuit and a second value indicating an automatic level control (ALC) mode of operation for the power control circuit. When the power control circuit is operated in the AGC mode, the voltage control signal corresponds to an AGC control voltage. When the power control circuit is operated in the ALC mode, the voltage control signal corresponds to an ALC reference voltage. In response to the mode control signal having the first value, the switch circuit supplies the AGC control voltage to the dual-mode AVGA as the attenuation control signal, and, in response to the mode control signal having the second value, the switching circuit supplies the ALC reference voltage to the power detector as the setpoint voltage signal and supplies the detector output signal to the dual-mode AVGA as the attenuation control signal. When the setpoint voltage signal corresponds to the ALC reference voltage, the power detector is configured to generate the detector output signal such that the detector output signal has a voltage indicative of the attenuation value required to bring the output RF signal in line with the ALC reference voltage.

In yet another general aspect, the instant disclosure presents a method of operating a transmission device of a wireless communication system. The method includes supplying an RF signal from a signal source to an RF signal path; supplying an attenuation control signal and a mode signal to a dual-mode analog variable gain attenuator (AVGA) of the RF signal path, the mode signal having one of a first value and a second value; attenuating the RF signal based on an attenuation value indicated by the attenuation control signal and based on a control mode indicated by the mode signal using the dual-mode AVGA; supplying the RF signal to an RF directional coupler, the RF directional coupler generating an output RF signal and a coupled RF signal from the RF signal; supplying the coupled RF signal to a power detector, the power detector being configured to generate a detector output signal based on the coupled RF signal and a setpoint voltage signal; supplying the mode control signal, the detector output signal, and a voltage control signal to a switch circuit; in response to the mode signal having the first value, supplying the voltage control signal as an AGC control voltage from the switch circuit to the dual-mode AVGA as the attenuation control signal; in response to the mode signal having the second value, supplying the voltage control signal as an ALC reference voltage from the switch circuit to the power detector as the setpoint voltage signal, and supplying the detector output signal from the switch circuit to the dual-mode AVGA as the attenuation control signal; and when the setpoint voltage signal corresponds to the ALC reference voltage, generating the detector output signal at the power detector such that the detector output signal has a voltage indicative of the attenuation value required to bring the output RF signal in line with the ALC reference voltage.

In a further general aspect, the instant application provides a power amplifier for a transmitter of a communication system. The power amplifier includes a radio frequency (RF) signal path having a signal source configured to generate an RF signal. The RF signal path also includes a dual-mode analog variable gain attenuator (AVGA) electrically coupled to receive (i) the RF signal, (ii) an attenuation control signal, and (iii) a mode signal. The dual-mode AVGA is configured to attenuate the RF signal based on an attenuation value indicated by the attenuation control signal. The mode signal indicates a control mode to be used by the dual-mode AVGA to determine the attenuation value based on the attenuation control signal. An RF directional coupler is electrically coupled to receive the RF signal from the dual-mode AVGA and to output an output RF signal and a coupled RF signal. The coupled RF signal is indicative of the output RF. A power control circuit includes a square law power detector electrically coupled to receive (i) the coupled RF signal and (ii) a setpoint voltage signal and to generate a detector output signal based on the coupled RF signal and the setpoint voltage signal. The power control circuit also includes a switch circuit electrically coupled to receive (i) the mode control signal, (ii) the detector output signal, and (iii) a voltage control signal. The mode signal has one of a first value indicating an open-loop automatic gain control (AGC) mode of operation for the power control circuit and a second value indicating an automatic level control (ALC) mode of operation for the power control circuit. When the power control circuit is operated in the AGC mode, the voltage control signal corresponds to an AGC control voltage. When the power control circuit is operated in the ALC mode, the voltage control signal corresponds to an ALC reference voltage. In response to the mode control signal having the first value, the switch circuit supplies the AGC control voltage to the dual-mode AVGA as the attenuation control signal, and, in response to the mode control signal having the second value, the switching circuit supplies the ALC reference voltage to the power detector as the setpoint voltage signal and supplies the detector output signal to the dual-mode AVGA as the attenuation control signal. When the setpoint voltage signal corresponds to the ALC reference voltage, the power detector is configured to generate the detector output signal such that the detector output signal has a voltage indicative of the attenuation value required to bring the output RF signal in line with the ALC reference voltage.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

DETAILED DESCRIPTION

Figure 1:
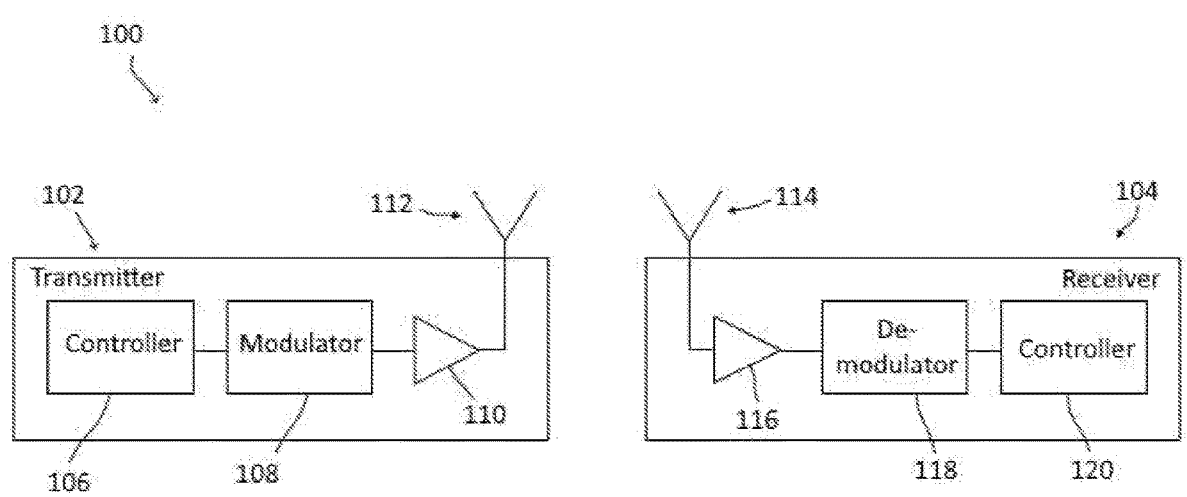
FIG. 1 shows an example communication system upon which aspects of this disclosure may be implemented.

In the following detailed description, numerous specific details are set forth by way of examples in order to provide a thorough understanding of the relevant teachings. It will be apparent to persons of ordinary skill, upon reading this description, that various aspects can be practiced without such details. In other instances, well known methods, procedures, components, and/or circuitry have been described at a relatively high-level, without detail, in order to avoid unnecessarily obscuring aspects of the present teachings.

As discussed above, RF transmitters are typically provided with power control circuits capable of utilizing either closed-loop or open-loop control for RF transmitters, but not both closed-loop and open-loop control schemes. As a result, users have very little flexibility in the implementation of RF transmitters because, once a power control scheme has been selected for an RF transmitter, it cannot be changed without physically modifying or replacing the transmitter or components of the transmitter.

To address these technical problems and more, in an example, this description provides technical solutions in the form of a dual-mode switchable power control circuit for an RF transmit signal path of an RF transmitter. The circuit is switchable between an open-loop automatic gain control (AGC) mode and a closed-loop automatic level control (ALC) mode in the analog domain to provide power control for the RF transmit signal path. The open-loop AGC mode and the closed-loop ALC mode are both controlled based on the analog control signal on the same control line. In the open-loop AGC mode, the analog control signal corresponds to the AGC control voltage indicating a setpoint gain for the RF transmit signal path. In the closed-loop ALC mode, the analog control signal corresponds to an ALC reference voltage indicating a setpoint power output level for the RF transmit signal path.

To implement the dual-mode switchable power control circuit, a mode signal is generated for selecting the operation mode (i.e., closed-loop or open-loop) of the power control circuit and a voltage control signal is generated for setting the gain or output power of the RF signal path. The power control circuit includes a dual-mode analog variable-gain attenuator (AVGA) that attenuates the RF signal based on the voltage control signal and a control characteristic set by the mode signal. An RF directional coupler is used to sample the output power of the RF signal path, which is provided to a square law power detector. A dual single pole, dual throw (SPDT) switch is utilized to select the voltage signal that is supplied to the dual-mode AVGA as the attenuation control signal and to the power detector as the setpoint voltage signal.

In the closed-loop ALC mode, the dual SPDT switch supplies the ALC reference voltage to the power detector as the setpoint voltage signal and the output of the power detector to the dual-mode AVGA as the attenuation control signal. In this mode, the output signal of the power detector has a voltage level that sets the gain of the dual-mode AVGA such that variations in the input signal and variations in the performance of the RF signal components due to temperature and other factors are compensated for as the RF signal output power is adjusted to correspond to output power indicated by the ALC reference voltage. In this mode, the control characteristic is set to a negative slope to create a negative feedback loop for the closed-loop ALC mode.

In the open-loop AGC mode, the dual SPDT switch supplies the AGC control voltage to the dual-mode AVGA to set the gain of the RF signal path and supplies the detector output to the power detector as the setpoint voltage signal. In this mode, the power detector acts as a measurement device such that the output is linear-in-dB proportional to the output power of the RF signal path. The detector output may be fed to the controller for monitoring purposes and/or for implementing digital closed-loop control of the AGC control voltage.

The technical solutions described herein address the technical problem of inefficiencies and difficulties due to the lack of flexibility in implementing closed-loop and open-loop power control schemes for power amplifiers of RF transmitters. In addition, the dual-mode switchable power control circuit can be implemented without adding a significant number of components or signal requirements relative to previously known control schemes.

FIG. 1 shows an example communication system 100 having a transmitter 102 in which the RF power control scheme according to the present disclosure may be implemented. The communication system 100 includes a transmitter 102 and a receiver 104. A single transmitter and a single receiver are depicted in although any number of transmitters and receivers may be utilized. The transmitter 102 includes a controller 106, a modulator 108, a power amplifier 110, and an antenna 114. The controller 106 serves as a data interface for receiving and processing data to be transmitted to the receiver 104. The modulator 108 is configured to modulate the data received from the controller 106 onto a carrier signal, i.e., an RF signal. The power amplifier 110 increases the output power of the RF signal to a suitable level for transmission to the receiver 104 and couples the RF signal to the antenna 114 for transmission. The receiver 104 includes an antenna 114, low noise amplifier 116, demodulator 118, and a controller 120. The antenna 114 receives the transmitted RF signal from the transmitter 102 and routes the signal to the demodulator 118. The demodulator 118 demodulates the RF signal and converts the electrical signals back into the original data. The low noise amplifier 116 may be used to reduce signal noise in certain frequency bands or increase the received signal strength. In embodiments, the functions of the transmitter 102 and receiver 104 may be combined into a radio transceiver that can both send and receive RF signals.

Figure 2:
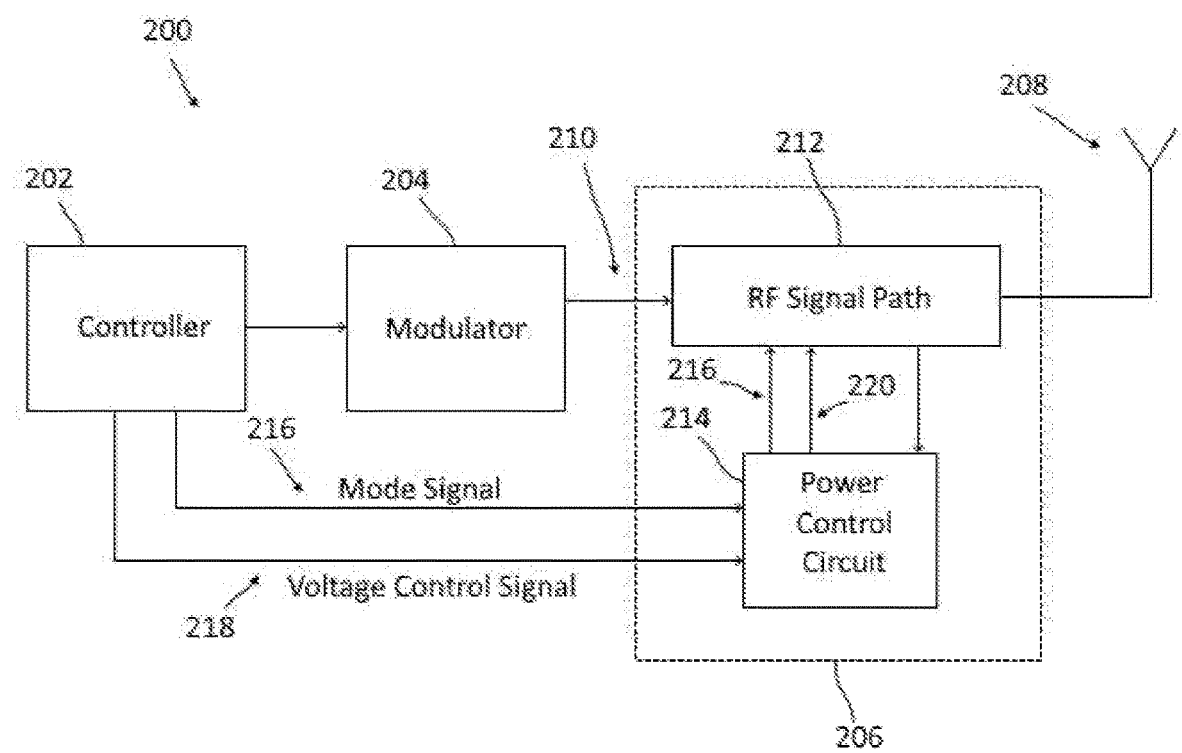
FIG. 2 shows an example implementation of a transmitter of the communication system of FIG. 1

FIG. 2 shows an example implementation of a transmitter 200 for a communication system, such as the transmitter 102 of FIG. 1. The transmitter 200 includes a controller 202, a modulator 204, a power amplifier 206, and an antenna 208, as described above. The controller 202 receives digital data that is to be transmitted by the transmitter and provides the digital data to the modulator 204 for modulation. The controller 202 may be configured to perform any suitable signal processing and/or pre-processing to format the data for modulation by the modulator. The modulator 204 is configured to modulate the digital data received from the controller onto an RF signal 210. In embodiments, the controller 202 may be implemented using one or more circuits, chips or other electronic components and may include one or more microcontrollers, field programmable gate arrays (FPGAs), application-specific integrated circuits (ASICs), digital signal processors signals (DSPs), etc. In embodiments, the modulator 204 may comprise a digital-to-analog converter (DAC).

The power amplifier 206 includes an RF signal path 212 and a dual-mode switchable power control circuit 214. The controller 202 is configured to generate a mode signal 216 and a voltage control signal 218 for the power control circuit 214. The mode signal 216 is used to select the mode of operation for the power control circuit 214, i.e., open-loop AGC mode or closed-loop ALC mode. In embodiments, the mode signal 216 may have a first value, e.g., high, for selecting the open-loop AGC mode of operation and a second value, e.g., low, for selecting the closed-loop ALC mode of operation. The voltage control signal 218 is used to provide an AGC control voltage or an ALC reference voltage depending on the selected mode of operation for the power control circuit 214. The power control circuit 214 is configured to set the gain for the RF signal path and in turn the output power for the RF signal path according to an attenuation control signal 220 that is supplied to the RF signal path (explained in more detail below). The RF signal path 212 is configured to receive the RF signal 210 from the modulator and is configured to amplify the RF signal to achieve the specified output power. The RF signal is then provided to the antenna 208 for transmission to a receiving device. The RF signal path provides feedback to the power control circuit 214 in the form of a coupled RF signal 222 which is indicative of the output power of the RF signal path.

Figure 3:
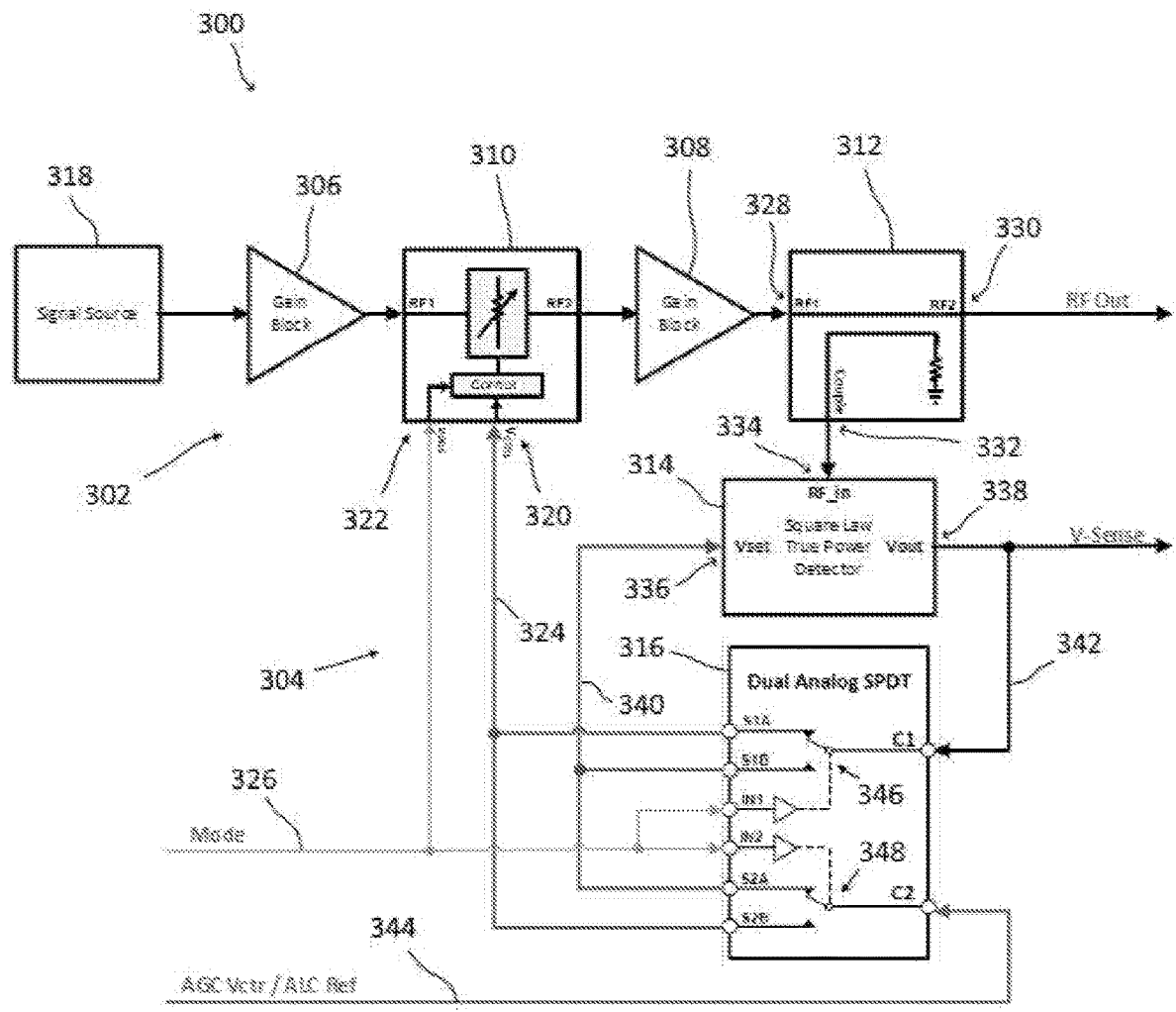
FIG. 3 shows an example implementation of a power amplifier of the transmitter of FIG. 2 including a dual-mode switchable power control circuit in accordance with this disclosure.

FIG. 3 shows an example implementation of a power amplifier 300 for an RF transmitter. The power amplifier 300 includes an RF signal path 302 and a dual-mode switchable power control circuit 304, such as discussed above. The RF signal path 302 includes fixed gain components 306, 308, a dual-mode analog, AVGA 310, and an RF directional coupler 312. The fixed gain components 306, 308 comprise one or more gain blocks which are positioned along the RF signal path for amplifying the RF signal according to predefined gain values. In the embodiment of FIG. 3, the fixed gain components include a first gain block 306 that receives an RF signal from a signal source 318 (i.e., controller and modulator) and is configured to amplify the RF signal according to a first predetermined gain value before the RF signal is supplied to the dual-mode AVGA 310. The fixed gain components also include a second gain block 308 that receives the RF signal from the dual-mode AVGA 310 and amplifies the RF signal according to a second predetermined gain value before supplying the RF signal to the RF directional coupler 312.

Figure 4:
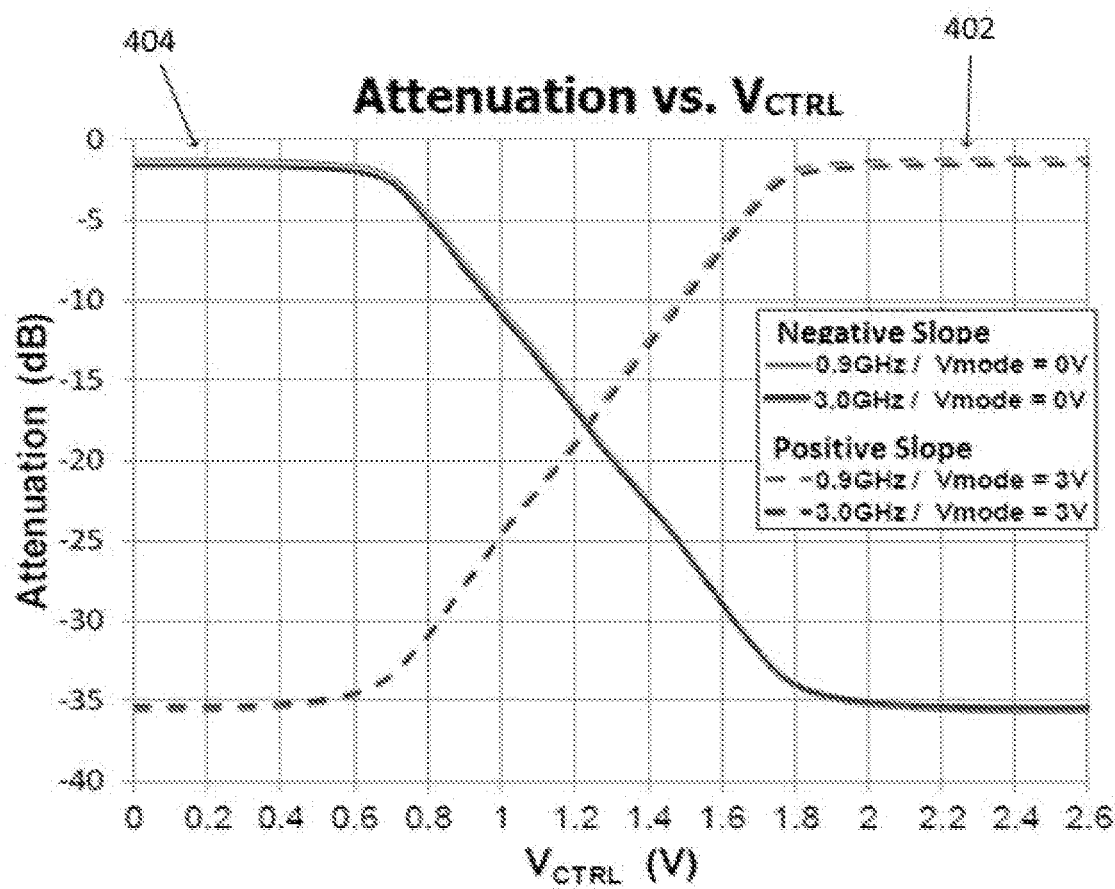
FIG. 4 shows an example graph of the control voltage versus the attenuation values for the positive slope control mode and the negative slope control mode for the dual-mode variable-gain attenuator of the power amplifier of FIG. 3.

The dual-mode AVGA 310 includes a first input 320 for receiving an attenuation control signal 324 that is indicative of the attenuation to be applied to the RF signal by the attenuator 310. The dual-mode AVGA 310 includes a second input 322 for receiving the mode signal 326. The mode signal 326 is used to set a control characteristic for the dual-mode AVGA 310. For example, different attenuation/voltage control curves and/or slopes may be used to select the gain/attenuation based on the value of the attenuation control signal. In embodiments, the control characteristic for the dual-mode AVGA 310 may be configured to have a positive slope (e.g., attenuation decreases with increases in voltage level of the attenuation control signal) for the open-loop AGC mode and a negative slope (e.g., attenuation increases with increases in the voltage level of the attenuation control signal) in closed-loop ALC mode. Examples of the characteristic curves having positive and negative slopes for the open-loop AGC mode and the closed-loop ALC mode, respectively, are shown in FIG. 4. The curve 402 having the dotted line (and positive slope) in FIG. 4 corresponds to the characteristic curve to be used for the closed-loop ALC mode while the curve 404 having the solid line (and negative slope) corresponds to the characteristic curve to be used for the open-loop ALC mode.

The dual-mode AVGA 310 receives the RF signal from the first gain block 306 and attenuates the RF signal in accordance with an attenuation value indicated by the attenuation control signal 324 with reference to the control characteristic set by the mode signal 326. The dual-mode AVGA 310 then outputs the RF signal to the second gain block 308.

The RF directional coupler 312 receives the RF signal from the second gain block 308. The RF directional coupler 312 is a three-port directional coupler including a first input port 328, a first output port 330, and a second output port 332. The first input port 328 is electrically coupled to receive the RF signal from the second gain block 308 and to provide the RF signal to the first output port 330. The RF signal is output by the first output port as an output RF signal which is provided to an antenna (not shown) for transmission. The coupler 312 is connected in the forward direction such that the second output port 332 (e.g., the coupled port) samples the input signal 328 power and outputs a coupled RF signal indicative of the level of the input signal power. The coupled RF signal is used by the power control circuit as part of the feedback for the closed-loop ALC control (discussed in more detail below).

In conjunction with the dual-mode AVGA 310 and the RF directional coupler 312, the dual-mode power control circuit 304 includes a power detector 314 and a switch circuit 316. The power detector 314 includes a first input 334 for receiving the coupled RF signal from the directional coupler 312, a second input 336 for receiving a setpoint voltage signal 340, and a first output 338 for outputting a detector signal 342. The detector signal 342 is based on the coupled RF signal and the setpoint voltage signal 340 and depends in part on the origin of the setpoint voltage signal (explained in more detail below). In embodiments, the power detector 314 comprises a square law power detector. A square law detector is a device that generates an output value that is proportional to the square of an input value. In embodiments, the square law power detector 314 is configured to generate a detector signal 342 having a value that is proportional to the square of the coupled RF signal. The detector output signal 342 represents the difference between RF input 334 detector voltage and the setpoint voltage 340.

Figure 5:
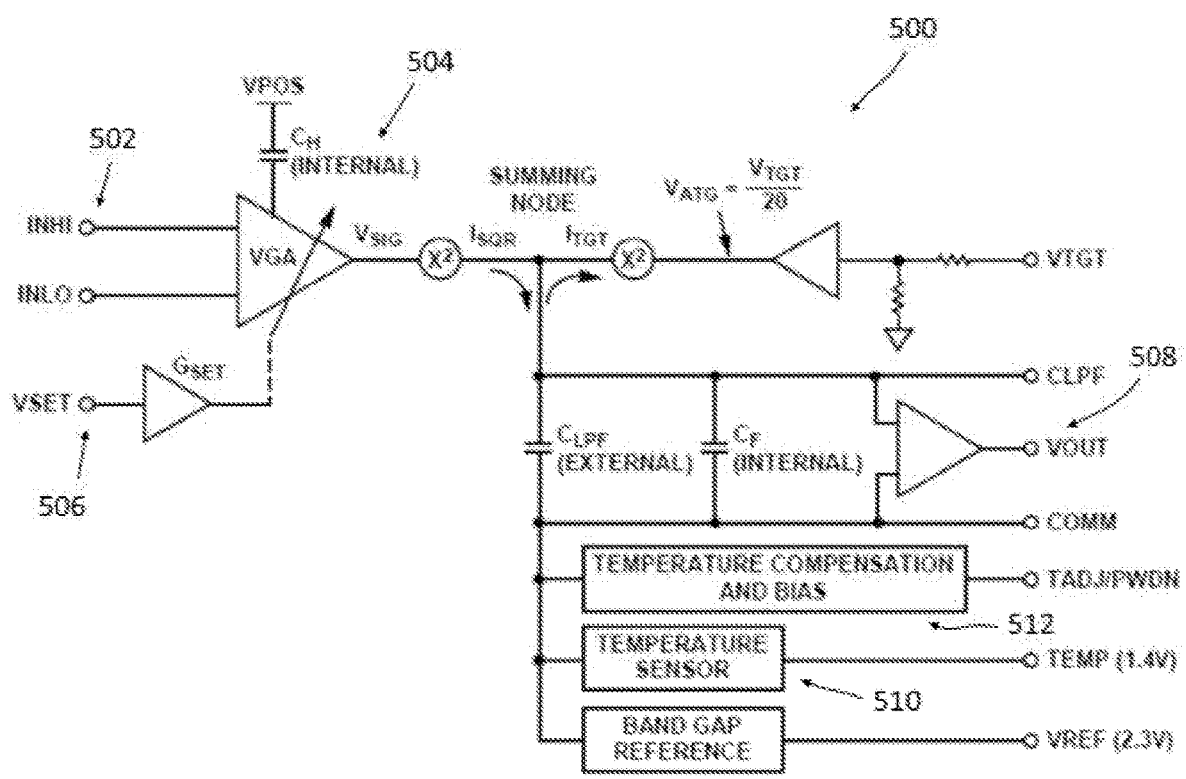
FIG. 5 shows an example implementation of the power detector of the dual-mode switchable power control circuit of FIG. 3.

An example implementation of a square law power detector 500 is depicted in FIG. 5. In FIG. 5, the coupled RF signal is supplied to the input node (INHI) 502 of a variable gain amplifier (VGA) 504. The setpoint voltage signal is supplied to the VSET input node 506 and is used to set the gain of the VGA 504. The detector output signal is taken from the VOUT node 508. When the voltage applied to the VSET node 506 corresponds to the output voltage at VOUT 508, the detector 500 operates as a power measurement device such that the output is linear-in-dB proportional to the coupled RF signal. Thus, when the square law power detector 500 is operated as a measurement device (e.g., when the detector signal is provided to the second input as the setpoint voltage signal), the output of the square law power detector 500 corresponds to a measurement of the output power of the RF signal path.

When the voltage applied to the VSET node 506 is not the output voltage VOUT, the detector operates in controller mode applied to VSET 506 (i.e., the setpoint voltage signal) determines the power level required at the input 502 (i.e., the power level required from the coupled RF signal) to null the deviation of the input from the setpoint voltage. In this mode, the value of the detector signal is used to set the attenuation of the dual-mode AVGA 310 in order to bring the output power of the RF signal path in line with the setpoint value at the detector. This is useful in the closed-loop ALC mode in which case the ALC reference voltage can be provided to the detector as the setpoint voltage signal which would result in the output signal indicating the power level required to adjust the output power of the RF signal path to correspond to the output power indicated by the ALC reference voltage.

As can be seen in FIG. 5, the square law power detector 500 includes a temperature sensor 510 and a temperature compensation circuit 512 for adjusting the output based on the detected temperature. The detector output therefore can be used to compensate for temperature variations of the components of the RF signal path as well as other variations that result in the output power deviating from a desired output power level.

Referring again to FIG. 3, the switch circuit 316 is electrically coupled to receive the mode signal 326, a voltage control signal 344 (from the controller), and the detector signal 342 as inputs, and the switch circuit 316 is electrically coupled to the dual-mode AVGA 310 (at input 320) to supply the attenuation control signal 324 and electrically coupled to the power detector 314 (at second input 336) to supply the setpoint voltage signal 340. The mode signal 326 is used to determine which inputs are connected to which outputs.

In embodiments, the switch circuit 316 comprises a dual analog single pole, double throw (SPDT) switch. The dual SPDT 316 includes a first input C1 electrically coupled to receive the detector signal 342 from the power detector 314 and a second input C2 electrically coupled to receive the voltage control signal 344. The dual SPDT 316 includes a first output S1A and a second output S1B associated with the first input C1, and a third output S2A and a fourth output S2B associated with the second input C2. As can be seen in FIG. 3, the first output S1A and the fourth output S2B are each electrically coupled to the first input 320 (i.e., the attenuation control signal input) of the dual-mode AVGA 310, and the second output S1B and the third output S2A are each electrically coupled to the second input 336 of the power detector (i.e., the setpoint voltage signal input).

The dual SPDT 316 includes a first switch 346 and a second switch 348 for switching the first input C1 and the second input C2, respectively, between their associated outputs. In particular, the first switch and the second switch each have a first switch position in which the first input C1 is connected to the first output S1A and the second input C2 is connected to the third output S2A, respectively, and a second switch position in which the first input C1 is connected to the second output S1B and the second input C2 is connected to the fourth output S2B, respectively. The dual SPDT 316 also includes switch control inputs IN1, IN2 which are electrically coupled to receive the mode signal 326. The dual SPDT 316 is configured to switch the first switch 346 and the second switch 348 between their respective first and second switch positions based on the value of the mode signal 326. In particular, when the mode signal 326 has a value corresponding to the closed-loop ALC mode, the first switch 346 and the second switch 348 are each placed in their first switch position, and, when the mode signal 326 has a value corresponding to the open-loop AGC mode, the first switch 346 and the second switch 348 are each placed in their second switch position.

Figure 6:
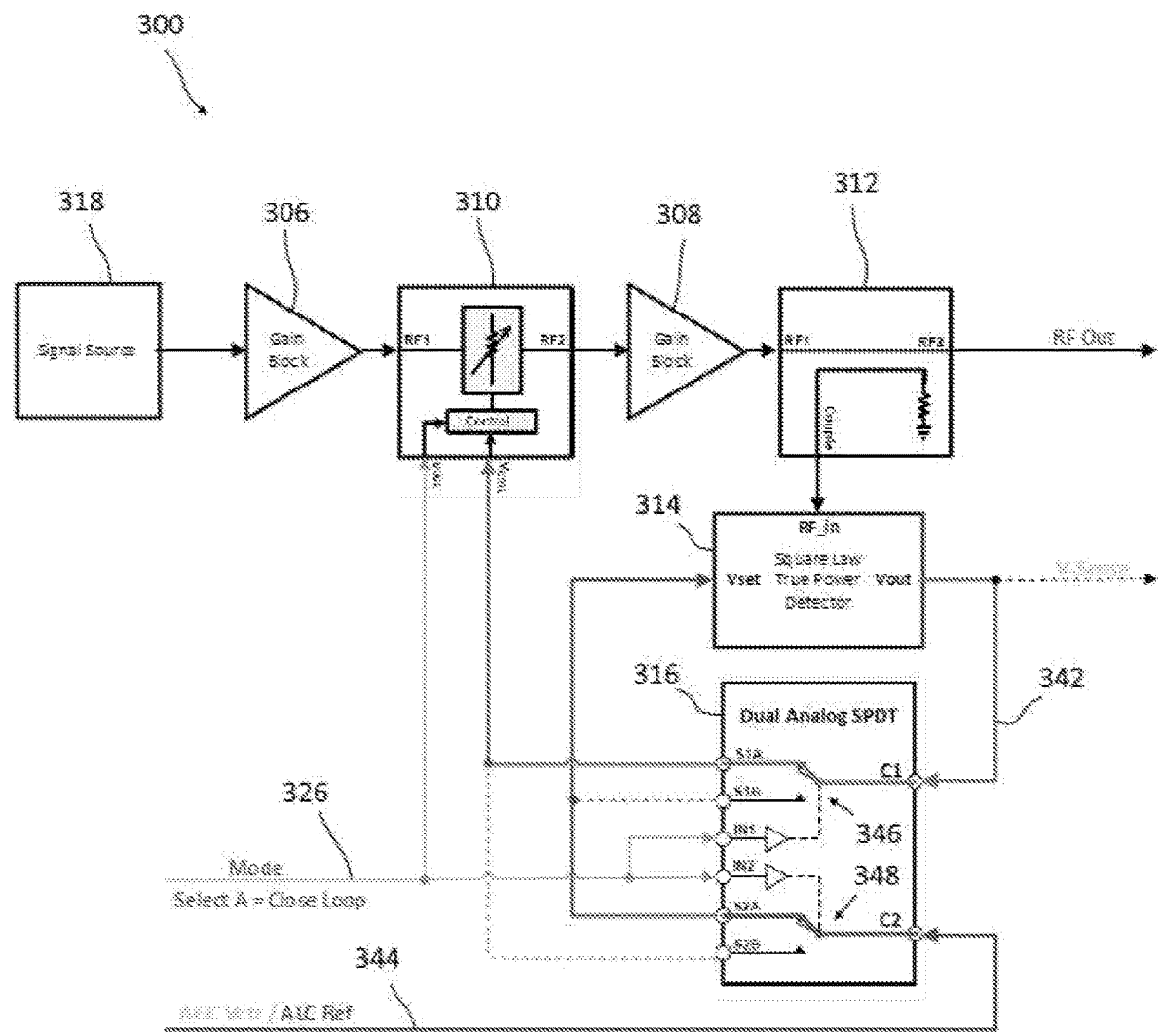
FIG. 6 depicts the power amplifier of FIG. 3 showing the active signal paths for implementing the closed-loop ALC mode of operation of the power control circuit.

The closed-loop ALC mode of operation for the power control circuit will now be described with reference to FIG. 6. To implement the closed-loop ALC mode, the controller sets the mode signal 326 to the value assigned to indicate the closed-loop ALC mode (e.g., high) and sets the voltage control signal 344 to an ALC reference voltage. In response to receiving the mode signal 326, the first switch 346 and the second switch 348 of the dual SPDT 316 are each in their first switch position such that the input C1 is connected to the output S1A and the input C2 is connected to the output S2A. As a result, the detector signal 342 is supplied to the dual-mode AVGA 310 as the attenuation control signal, and the ALC reference voltage 344 is supplied to the power detector 314 as the setpoint voltage signal. The power detector 314 operates in controller mode such that the value of the detector signal 342 is configured to adjust the output power of the RF signal path to correspond to the output power indicated by the ALC reference voltage 344 thereby compensating for variations in input signal level and variations in performance of components due to temperature and other factors. The dual-mode AVGA 310 uses the voltage level of the detector signal 342 to determine the attenuation value to apply to the RF signal. The dual-mode AVGA 310 also receives the mode signal 326 and operates in a negative slope mode to create a negative feedback loop for the closed-loop ALC mode.

Figure 7:
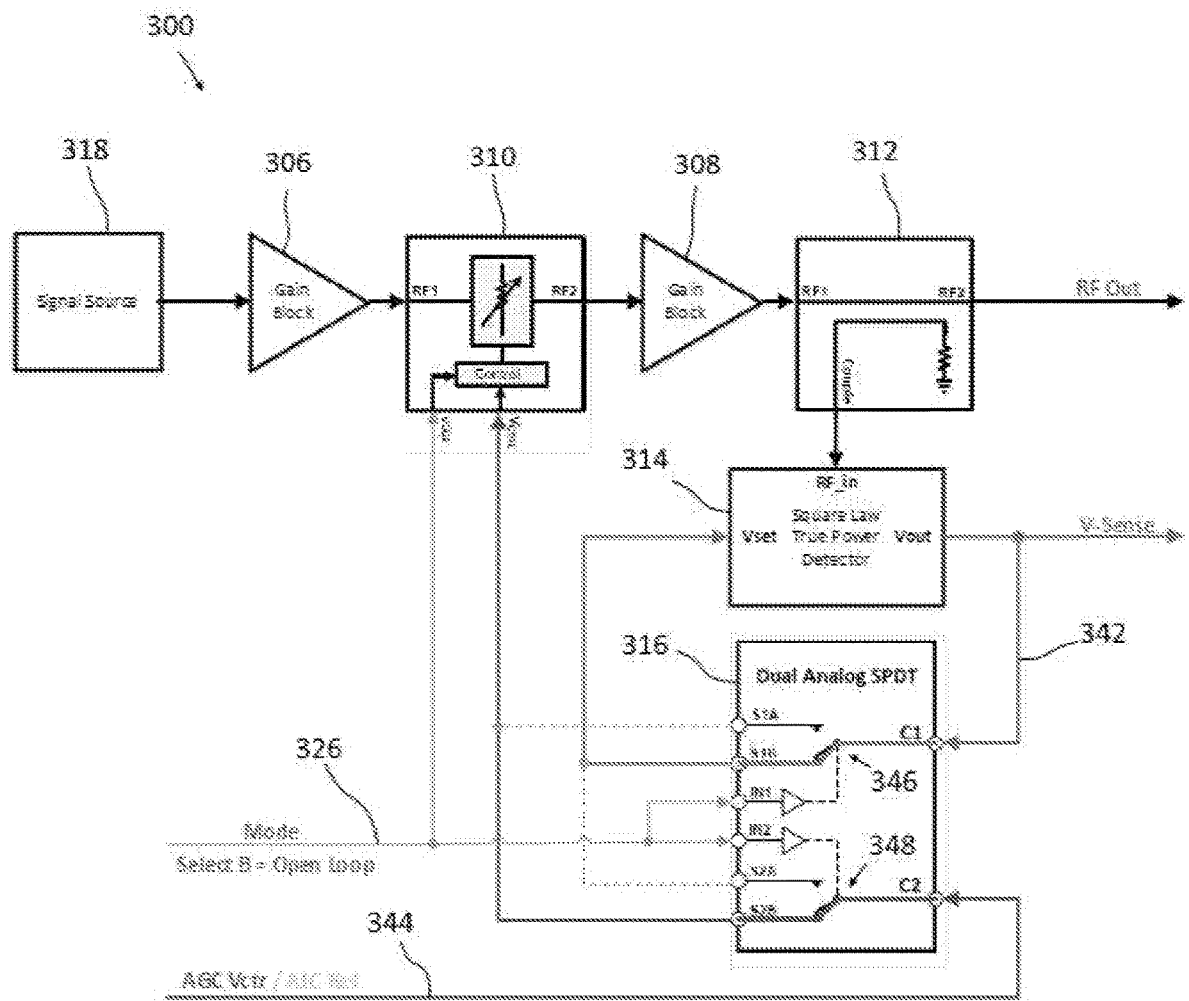
FIG. 7 depicts the power amplifier of FIG. 3 showing the active signal paths for implementing the open-loop AGC mode of operation of the power control circuit.

The open-loop AGC mode of operation for the power control circuit will now be described with reference to FIG. 7. To implement the open-loop AGC mode, the controller sets the mode signal 326 to the value assigned to indicate the open-loop ALC mode (e.g., low) and sets the voltage control signal 326 to an AGC control voltage. In response to receiving the mode signal 326, the first switch 346 and the second switch 348 are each placed in their second switch position such that the input C1 is connected to the output S1B and the input C2 is connected to the output S2B. As a result, the detector output signal 342 is supplied to the power detector 342 to Vset input to operate in the measurement mode. The AGC control voltage 344 is supplied to the dual-mode AVGA 310 as the attenuation control signal directly. The dual-mode AVGA 310 uses the voltage level of the AGC control signal 344 to determine the attenuation value to apply to the RF signal. The dual-mode AVGA 310 also receives the mode signal 326 and operates in a positive slope mode for determining the attenuation value. The power detector 314 operates as a measurement device such that the voltage level of the output of the detector 314 is indicative of the output power level of the RF signal path. In embodiments, the detector measurement signal may be supplied to a controller as a monitoring parameter and/or for implementing a digital closed-loop control scheme for adjusting the AGC control signal.

Figure 8:
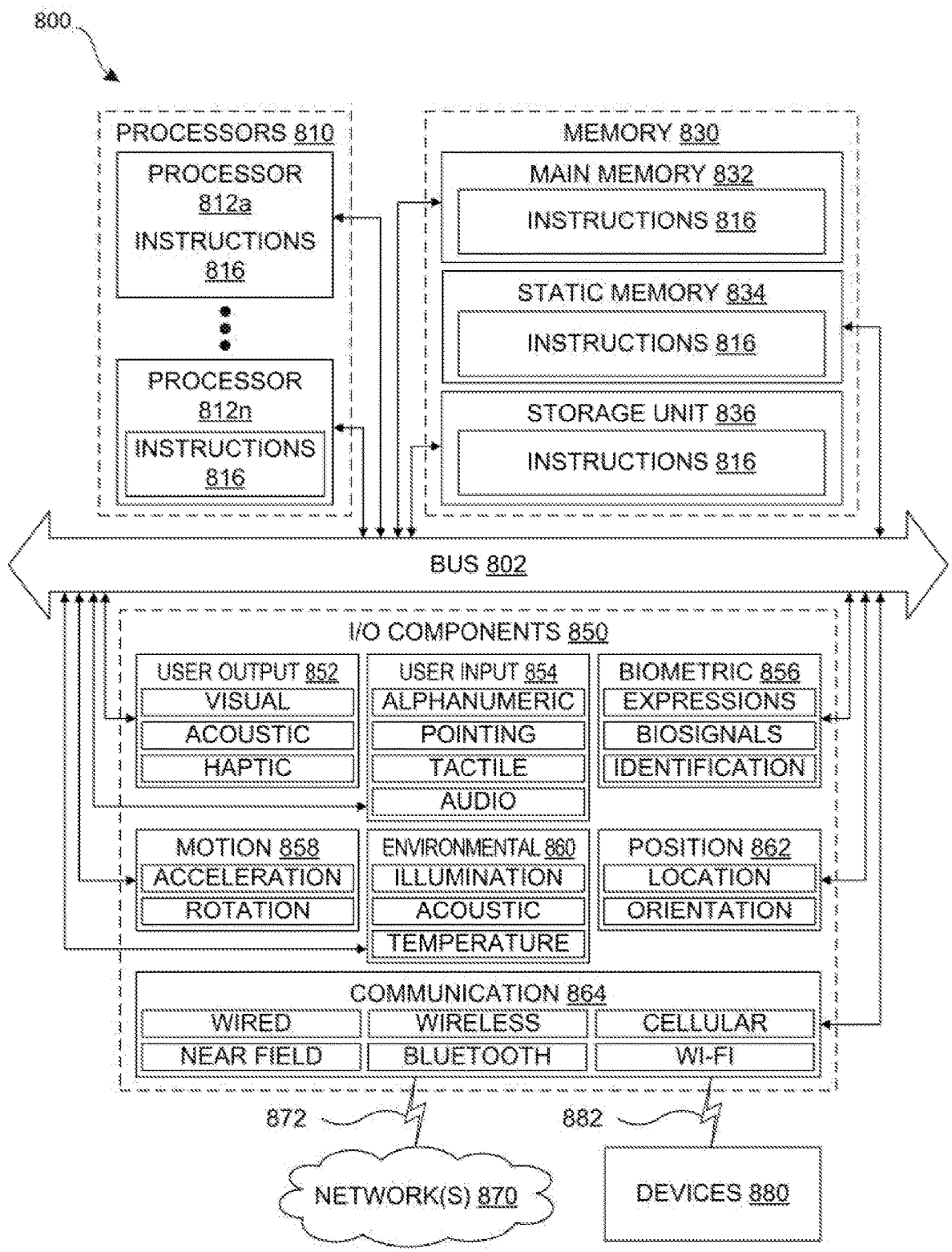
FIG. 8 is a block diagram illustrating components of an example machine configured to read instructions from a machine-readable medium and perform any of the features described herein.

FIG. 8 is a block diagram illustrating components of an example machine 800 configured to read instructions from a machine-readable medium (for example, a machine-readable storage medium) and perform any of the features described herein. The example machine 800 is in the form of a computer system, within which instructions 816 (for example, in the form of software components) for causing the machine 800 to perform any of the features described herein may be executed. As such, the instructions 816 may be used to implement modules or components described herein. The instructions 816 cause unprogrammed and/or unconfigured machine 800 to operate as a particular machine configured to carry out the described features. The machine 800 may be configured to operate as a standalone device or may be coupled (for example, networked) to other machines. In a networked deployment, the machine 800 may operate in the capacity of a server machine or a client machine in a server-client network environment, or as a node in a peer-to-peer or distributed network environment. Machine 800 may be embodied as, for example, a server computer, a client computer, a personal computer (PC), a tablet computer, a laptop computer, a netbook, a set-top box (STB), a gaming and/or entertainment system, a smart phone, a mobile device, a wearable device (for example, a smart watch), and an Internet of Things (IoT) device. Further, although only a single machine 800 is illustrated, the term "machine" includes a collection of machines that individually or jointly execute the instructions 816.

The machine 800 may include processors 810, memory 830, and I/O components 850, which may be communicatively coupled via, for example, a bus 802. The bus 802 may include multiple buses coupling various elements of machine 800 via various bus technologies and protocols. In an example, the processors 810 (including, for example, a central processing unit (CPU), a graphics processing unit (GPU), a digital signal processor (DSP), an ASIC, or a suitable combination thereof) may include one or more processors $812a$ to $812n$ that may execute the instructions 816 and process data. In some examples, one or more processors 810 may execute instructions provided or identified by one or more other processors 810. The term "processor" includes a multi-core processor including cores that may execute instructions contemporaneously. Although FIG. 8 shows multiple processors, the machine 800 may include a single processor with a single core, a single processor with multiple cores (for example, a multi-core processor), multiple processors each with a single core, multiple processors each with multiple cores, or any combination thereof. In some examples, the machine 800 may include multiple processors distributed among multiple machines.

The memory/storage 830 may include a main memory 832, a static memory 834, or other memory, and a storage unit 836, both accessible to the processors 810 such as via the bus 802. The storage unit 836 and memory 832, 834 store instructions 816 embodying any one or more of the functions described herein. The memory/storage 830 may also store temporary, intermediate, and/or long-term data for processors 810. The instructions 816 may also reside, completely or partially, within the memory 832, 834, within the storage unit 836, within at least one of the processors 810 (for example, within a command buffer or cache memory), within memory at least one of I/O components 850, or any suitable combination thereof, during execution thereof. Accordingly, the memory 832, 834, the storage unit 836, memory in processors 810, and memory in I/O components 850 are examples of machine-readable media.

As used herein, "machine-readable medium" refers to a device able to temporarily or permanently store instructions and data that cause machine 800 to operate in a specific fashion, and may include, but is not limited to, random-access memory (RAM), read-only memory (ROM), buffer memory, flash memory, optical storage media, magnetic storage media and devices, cache memory, network-accessible or cloud storage, other types of storage and/or any suitable combination thereof. The term "machine-readable medium" applies to a single medium, or combination of multiple media, used to store instructions (for example, instructions 816) for execution by a machine 800 such that the instructions, when executed by one or more processors 810 of the machine 800, cause the machine 800 to perform and one or more of the features described herein. Accordingly, a "machine-readable medium" may refer to a single storage device, as well as "cloud-based" storage systems or storage networks that include multiple storage apparatus or devices. The term "machine-readable medium" excludes signals per se.

The I/O components 850 may include a wide variety of hardware components adapted to receive input, provide output, produce output, transmit information, exchange information, capture measurements, and so on. The specific I/O components 850 included in a particular machine will depend on the type and/or function of the machine. For example, mobile devices such as mobile phones may include a touch input device, whereas a headless server or IoT device may not include such a touch input device. The particular examples of I/O components illustrated in FIG. 8 are in no way limiting, and other types of components may be included in machine 800. The grouping of I/O components 850 are merely for simplifying this discussion, and the grouping is in no way limiting. In various examples, the I/O components 850 may include user output components 852 and user input components 854. User output components 852 may include, for example, display components for displaying information (for example, a liquid crystal display (LCD) or a projector), acoustic components (for example, speakers), haptic components (for example, a vibratory motor or force-feedback device), and/or other signal generators. User input components 854 may include, for example, alphanumeric input components (for example, a keyboard or a touch screen), pointing components (for example, a mouse device, a touchpad, or another pointing instrument), and/or tactile input components (for example, a physical button or a touch screen that provides location and/or force of touches or touch gestures) configured for receiving various user inputs, such as user commands and/or selections.

In some examples, the I/O components 850 may include biometric components 856, motion components 858, environmental components 860, and/or position components 862, among a wide array of other physical sensor components. The biometric components 856 may include, for example, components to detect body expressions (for example, facial expressions, vocal expressions, hand or body gestures, or eye tracking), measure biosignals (for example, heart rate or brain waves), and identify a person (for example, via voice-, retina-, fingerprint-, and/or facial-based identification). The motion components 858 may include, for example, acceleration sensors (for example, an accelerometer) and rotation sensors (for example, a gyroscope). The environmental components 860 may include, for example, illumination sensors, temperature sensors, humidity sensors, pressure sensors (for example, a barometer), acoustic sensors (for example, a microphone used to detect ambient noise), proximity sensors (for example, infrared sensing of nearby objects), and/or other components that may provide indications, measurements, or signals corresponding to a surrounding physical environment. The position components 862 may include, for example, location sensors (for example, a Global Position System (GPS) receiver), altitude sensors (for example, an air pressure sensor from which altitude may be derived), and/or orientation sensors (for example, magnetometers).

The I/O components 850 may include communication components 864, implementing a wide variety of technologies operable to couple the machine 800 to network(s) 870 and/or device(s) 880 via respective communicative couplings 872 and 882. The communication components 864 may include one or more network interface components or other suitable devices to interface with the network(s) 870. The communication components 864 may include, for example, components adapted to provide wired communication, wireless communication, cellular communication, Near Field Communication (NFC), Bluetooth communication, Wi-Fi, and/or communication via other modalities. The device(s) 880 may include other machines or various peripheral devices (for example, coupled via USB).

In some examples, the communication components 864 may detect identifiers or include components adapted to detect identifiers. For example, the communication components 864 may include Radio Frequency Identification (RFID) tag readers, NFC detectors, optical sensors (for example, one- or multi-dimensional bar codes, or other optical codes), and/or acoustic detectors (for example, microphones to identify tagged audio signals). In some examples, location information may be determined based on information from the communication components 864, such as, but not limited to, geo-location via Internet Protocol (IP) address, location via Wi-Fi, cellular, NFC, Bluetooth, or other wireless station identification and/or signal triangulation.

In the following, further features, characteristics and advantages of the invention will be described by means of items:

Item 1. A transmission device for a communication system, the transmission device comprising:
a radio frequency (RF) signal path including:
a signal source configured to generate an RF signal;
a dual-mode analog variable gain attenuator (AVGA) electrically coupled to receive (i) the RF signal, (ii) an attenuation control signal, and (iii) a mode signal, the dual-mode AVGA being configured to attenuate the RF signal based on an attenuation value indicated by the attenuation control signal, the mode signal indicating a control mode to be used by the dual-mode AVGA to determine the attenuation value based on the attenuation control signal; and
an RF directional coupler electrically coupled to receive the RF signal from the dual-mode AVGA and to output an output RF signal and a coupled RF signal, the coupled RF signal being indicative of the output RF; and
a power control circuit including:

a power detector electrically coupled to receive (i) the coupled RF signal and (ii) a setpoint voltage signal and to generate a detector output signal based on the coupled RF signal and the setpoint voltage signal; and a switch circuit electrically coupled to receive (i) the mode control signal, (ii) the detector output signal, and (iii) a voltage control signal, wherein the mode signal has one of a first value indicating an open-loop automatic gain control (AGC) mode of operation for the power control circuit and a second value indicating an automatic level control (ALC) mode of operation for the power control circuit, wherein, when the power control circuit is operated in the AGC mode, the voltage control signal corresponds to an AGC control voltage, wherein, when the power control circuit is operated in the ALC mode, the voltage control signal corresponds to an ALC reference voltage, wherein, in response to the mode control signal having the first value, the switch circuit supplies the AGC control voltage to the dual-mode AVGA as the attenuation control signal, wherein, in response to the mode control signal having the second value, the switching circuit supplies the ALC reference voltage to the power detector as the setpoint voltage signal and supplies the detector output signal to the dual-mode AVGA as the attenuation control signal, and wherein, when the setpoint voltage signal corresponds to the ALC reference voltage, the power detector is configured to generate the detector output signal such that the detector output signal has a voltage indicative of the attenuation value required to bring the output RF signal in line with the ALC reference voltage.

Item 2. The transmission device of item 1, wherein the power detector comprises a square law power detector.

Item 3. The transmission device of any of items 1-2, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal having a voltage level that is linear-in-dB proportional to a voltage level of the coupled RF signal.

Item 4. The transmission device of any of items 1-3, wherein the RF signal path includes a first gain block that amplifies the RF signal received from the signal source by a first predetermined gain before the RF signal is supplied to the dual-mode AVGA.

Item 5. The transmission device of any of items 1-4, wherein the RF signal path includes a second gain block that amplifies the RF signal received from the dual-mode AVGA by a second predetermined gain before the RF signal is supplied to the RF directional coupler.

Item 6. The transmission device of any of items 1-5, wherein the dual-mode AVGA includes a first input that receives the mode signal and a second input that receives the voltage control signal, and wherein the detector includes a first input that receives the setpoint voltage signal and a first output that outputs the detector output signal.

Item 7. The transmission device of any of items 1-6, wherein the switch circuit comprises a dual single pole, double throw (SPDT) switch including:

a first SPDT input electrically coupled to first output of the power detector;

a second SPDT input electrically coupled to receive the voltage control signal;

a first SPDT output electrically coupled to the second input of the dual-mode AVGA;

a second SPDT output electrically coupled to the first input of the power detector;

a third SPDT output electrically coupled to the first input of the power detector;

a fourth SPDT input electrically coupled to the second input of the dual-mode AVGA;

a first switch that switches the first SPDT input between the first SPDT output and the second SPDT output; and a second switch that switches the second SPDT input between the third SPDT output and the fourth SPDT output, wherein the dual SPDT is configured such that the first switch connects the first SPDT input to the first SPDT output and the second switch connects the second SPDT input to the third SPDT output in response to the mode signal having the first value, and wherein the dual SPDT is configured such that the first switch connects the first SPDT input to the second SPDT output and the second switch connects the second SPDT input to the fourth SPDT output in response to the mode signal having the second value.

Item 8. The transmission device of any of items 1-7, wherein the dual-mode AVGA has a first control mode for determining the attenuation value when the mode signal has the first value, the first control mode having a positive control slope such that as a voltage level of the attenuation control signal increases, the attenuation value indicated by the attenuation control signal increases.

Item 9. The transmission device of any of items 1-8, wherein the dual-mode AVGA has a second control mode for determining the attenuation value when the mode signal has the second value, the second control mode having a negative control slope such that as the voltage level of the attenuation control signal increases, the attenuation value indicated by the attenuation control signal decreases.

Item 10. A method of operating a transmission device of a wireless communication system, the method comprising:

supplying an RF signal from a signal source to an RF signal path;

supplying an attenuation control signal and a mode signal to a dual-mode analog variable gain attenuator (AVGA) of the RF signal path, the mode signal having one of a first value and a second value;

attenuating the RF signal based on an attenuation value indicated by the attenuation control signal and based on a control mode indicated by the mode signal using the dual-mode AVGA;

supplying the RF signal to an RF directional coupler, the RF directional coupler generating an output RF signal and a coupled RF signal from the RF signal;

supplying the coupled RF signal to a power detector, the power detector being configured to generate a detector output signal based on the coupled RF signal and a setpoint voltage signal;

supplying the mode control signal, the detector output signal, and a voltage control signal to a switch circuit;

in response to the mode signal having the first value, supplying the voltage control signal as an AGC control voltage from the switch circuit to the dual-mode AVGA as the attenuation control signal;

in response to the mode signal having the second value, supplying the voltage control signal as an ALC reference voltage from the switch circuit to the power detector as the setpoint voltage signal, and supplying the detector output signal from the switch circuit to the dual-mode AVGA as the attenuation control signal; and when the setpoint voltage signal corresponds to the ALC reference voltage, generating the detector output signal at the power detector such that the detector output signal has a voltage indicative of the attenuation value required to bring the output RF signal in line with the ALC reference voltage.

Item 11. The method of item 10, wherein the power detector comprises a square law power detector.

Item 12. The method of any of items 10-11, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal has a voltage level that is linear-in-dB proportional to a voltage level of the coupled RF signal Item 13. The method of any of items 10-12, wherein the RF signal path includes a first gain block that amplifies the RF signal received from the signal source by a first predetermined gain before the RF signal is supplied to the dual-mode AVGA.

Item 14. The method of any of items 10-13, wherein the RF signal path includes a second gain block that amplifies the RF signal received from the dual-mode AVGA by a second predetermined gain before the RF signal is supplied to the RF directional coupler.

Item 15. The method of any of items 10-14, wherein the dual-mode AVGA includes a first input that receives the mode signal and a second input that receives the voltage control signal, and wherein the detector includes a first input that receives the setpoint voltage signal and a first output that outputs the detector output signal.

Item 16. The method of any of items 10-15, wherein the switch circuit comprises a dual single pole, double throw (SPDT) switch including:

a first SPDT input electrically coupled to first output of the power detector;

a second SPDT input electrically coupled to receive the voltage control signal;

a first SPDT output electrically coupled to the second input of the dual-mode AVGA;

a second SPDT output electrically coupled to the first input of the power detector;

a third SPDT output electrically coupled to the first input of the power detector;

a fourth SPDT input electrically coupled to the second input of the dual-mode AVGA;

a first switch that switches the first SPDT input between the first SPDT output and the second SPDT output; and a second switch that switches the second SPDT input between the third SPDT output and the fourth SPDT output, wherein the dual SPDT is configured such that the first switch connects the first SPDT input to the first SPDT output and the second switch connects the second SPDT input to the third SPDT output in response to the mode signal having the first value, and wherein the dual SPDT is configured such that the first switch connects the first SPDT input to the second SPDT output and the second switch connects the second SPDT input to the fourth SPDT output in response to the mode signal having the second value.

Item 17. The method of any of items 10-16, wherein the dual-mode AVGA has a first control mode for determining the attenuation value when the mode signal has the first value, the first control mode having a positive control slope.

Item 18. The method of any of items 10-17, wherein the dual-mode AVGA has a second control mode for determining the attenuation value when the mode signal has the second value, the second control mode having a negative control slope.

Item 19. A power amplifier for a transmitter of a communication system, the power amplifier comprising:

a radio frequency (RF) signal path including:
  a signal source configured to generate an RF signal;
  a dual-mode analog variable gain attenuator (AVGA) electrically coupled to receive (i) the RF signal, (ii) an attenuation control signal, and (iii) a mode signal, the dual-mode AVGA being configured to attenuate the RF signal based on an attenuation value indicated by the attenuation control signal, the mode signal indicating a control mode to be used by the dual-mode AVGA to determine the attenuation value based on the attenuation control signal; and
  an RF directional coupler electrically coupled to receive the RF signal from the dual-mode AVGA and to output an output RF signal and a coupled RF signal based on, the coupled RF signal being indicative of the output RF; and a power control circuit including:
  a square law power detector electrically coupled to receive (i) the coupled RF signal and (ii) a setpoint voltage signal and to generate a detector output signal based on the coupled RF signal and the setpoint voltage signal; and
  a switch circuit electrically coupled to receive (i) the mode control signal, (ii) the detector output signal, and (iii) a voltage control signal, wherein the mode signal has one of a first value indicating an open-loop automatic gain control (AGC) mode of operation for the power control circuit and a second value indicating an automatic level control (ALC) mode of operation for the power control circuit, wherein, when the power control circuit is operated in the AGC mode, the voltage control signal corresponds to an AGC control voltage, wherein, when the power control circuit is operated in the ALC mode, the voltage control signal corresponds to an ALC reference voltage, wherein, in response to the mode control signal having the first value, the switch circuit supplies the AGC control voltage to the dual-mode AVGA as the attenuation control signal, wherein, in response to the mode control signal having the second value, the switching circuit supplies the ALC reference voltage to the square law power detector as the setpoint voltage signal and supplies the detector output signal to the dual-mode AVGA as the attenuation control signal, and wherein, when the setpoint voltage signal corresponds to the ALC reference voltage, the square law power detector is configured to generate the detector output signal such that the detector output signal has a voltage indicative of the attenuation value required to bring the output RF signal in line with the ALC reference voltage.

Item 20. The power amplifier of item 19, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal having a voltage level that is linear-in-dB proportional to a voltage level of the coupled RF signal.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A transmission device for a communication system, the transmission device comprising:
a radio frequency (RF) signal path including:
a signal source configured to generate an RF signal;
a dual-mode analog variable gain attenuator (AVGA) electrically coupled to receive (i) the RF signal, (ii) an attenuation control signal, and (iii) a mode signal, the dual-mode AVGA being configured to attenuate the RF signal based on an attenuation value indicated by the attenuation control signal, the mode signal indicating a control mode to be used by the dual-mode AVGA to determine the attenuation value based on the attenuation control signal; and
an RF directional coupler electrically coupled to receive the RF signal from the dual-mode AVGA and to output an output RF signal and a coupled RF signal, the coupled RF signal being indicative of the output RF; and a power control circuit including:
a power detector electrically coupled to receive (i) the coupled RF signal and (ii) a setpoint voltage signal and to generate a detector output signal based on the coupled RF signal and the setpoint voltage signal; and a switch circuit electrically coupled to receive (i) the mode control signal, (ii) the detector output signal, and (iii) a voltage control signal, wherein the mode signal has one of a first value indicating an open-loop automatic gain control (AGC) mode of operation for the power control circuit and a second value indicating an automatic level control (ALC) mode of operation for the power control circuit, wherein, when the power control circuit is operated in the AGC mode, the voltage control signal corresponds to an AGC control voltage, wherein, when the power control circuit is operated in the ALC mode, the voltage control signal corresponds to an ALC reference voltage, wherein, in response to the mode control signal having the first value, the switch circuit supplies the AGC control voltage to the dual-mode AVGA as the attenuation control signal, wherein, in response to the mode control signal having the second value, the switching circuit supplies the ALC reference voltage to the power detector as the setpoint voltage signal and supplies the detector output signal to the dual-mode AVGA as the attenuation control signal, and wherein, when the setpoint voltage signal corresponds to the ALC reference voltage, the power detector is configured to generate the detector output signal such that the detector output signal has a voltage indicative of the attenuation value required to bring the output RF signal in line with the ALC reference voltage.

2. The transmission device of claim 1, wherein the power detector comprises a square law power detector.

3. The transmission device of claim 1, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal having a voltage level that is linear-in-dB proportional to a voltage level of the coupled RF signal.

4. The transmission device of claim 1, wherein the RF signal path includes a first gain block that amplifies the RF signal received from the signal source by a first predetermined gain before the RF signal is supplied to the dual-mode AVGA.

5. The transmission device of claim 4, wherein the RF signal path includes a second gain block that amplifies the RF signal received from the dual-mode AVGA by a second predetermined gain before the RF signal is supplied to the RF directional coupler.

6. The transmission device of claim 1, wherein the dual-mode AVGA includes a first input that receives the mode signal and a second input that receives the voltage control signal, and wherein the detector includes a first input that receives the setpoint voltage signal and a first output that outputs the detector output signal.

7. The transmission device of claim 6, wherein the switch circuit comprises a dual single pole, double throw (SPDT) switch including:
a first SPDT input electrically coupled to first output of the power detector;
a second SPDT input electrically coupled to receive the voltage control signal;
a first SPDT output electrically coupled to the second input of the dual-mode AVGA;
a second SPDT output electrically coupled to the first input of the power detector;
a third SPDT output electrically coupled to the first input of the power detector;
a fourth SPDT input electrically coupled to the second input of the dual-mode AVGA;
a first switch that switches the first SPDT input between the first SPDT output and the second SPDT output; and
a second switch that switches the second SPDT input between the third SPDT output and the fourth SPDT output,
wherein the dual SPDT is configured such that the first switch connects the first SPDT input to the first SPDT output and the second switch connects the second SPDT input to the third SPDT output in response to the mode signal having the first value, and
wherein the dual SPDT is configured such that the first switch connects the first SPDT input to the second SPDT output and the second switch connects the second SPDT input to the fourth SPDT output in response to the mode signal having the second value.

8. The transmission device of claim 1, wherein the dual-mode AVGA has a first control mode for determining the attenuation value when the mode signal has the first value, the first control mode having a positive control slope such that as a voltage level of the attenuation control signal increases, the attenuation value indicated by the attenuation control signal increases.

9. The transmission device of claim 1, wherein the dual-mode AVGA has a second control mode for determining the attenuation value when the mode signal has the second value, the second control mode having a negative control slope such that as the voltage level of the attenuation control signal increases, the attenuation value indicated by the attenuation control signal decreases.

10. A method of operating a transmission device of a wireless communication system, the method comprising:
supplying an RF signal from a signal source to an RF signal path;
supplying an attenuation control signal and a mode signal to a dual-mode analog variable gain attenuator (AVGA) of the RF signal path, the mode signal having one of a first value and a second value;
attenuating the RF signal based on an attenuation value indicated by the attenuation control signal and based on a control mode indicated by the mode signal using the dual-mode AVGA;
supplying the RF signal to an RF directional coupler, the RF directional coupler generating an output RF signal and a coupled RF signal from the RF signal;
supplying the coupled RF signal to a power detector, the power detector being configured to generate a detector output signal based on the coupled RF signal and a setpoint voltage signal;

supplying the mode control signal, the detector output signal, and a voltage control signal to a switch circuit;

in response to the mode signal having the first value, supplying the voltage control signal as an AGC control voltage from the switch circuit to the dual-mode AVGA as the attenuation control signal;

in response to the mode signal having the second value, supplying the voltage control signal as an ALC reference voltage from the switch circuit to the power detector as the setpoint voltage signal, and supplying the detector output signal from the switch circuit to the dual-mode AVGA as the attenuation control signal; and when the setpoint voltage signal corresponds to the ALC reference voltage, generating the detector output signal at the power detector such that the detector output signal has a voltage indicative of the attenuation value required to bring the output RF signal in line with the ALC reference voltage.

11. The method of claim 10, wherein the power detector comprises a square law power detector.

12. The method of claim 10, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal has a voltage level that is linear-in-dB proportional to a voltage level of the coupled RF signal.

13. The method of claim 10, wherein the RF signal path includes a first gain block that amplifies the RF signal received from the signal source by a first predetermined gain before the RF signal is supplied to the dual-mode AVGA.

14. The method of claim 13, wherein the RF signal path includes a second gain block that amplifies the RF signal received from the dual-mode AVGA by a second predetermined gain before the RF signal is supplied to the RF directional coupler.

15. The method of claim 10, wherein the dual-mode AVGA includes a first input that receives the mode signal and a second input that receives the voltage control signal, and wherein the detector includes a first input that receives the setpoint voltage signal and a first output that outputs the detector output signal.

16. The method of claim 15, wherein the switch circuit comprises a dual single pole, double throw (SPDT) switch including:

a first SPDT input electrically coupled to first output of the power detector;

a second SPDT input electrically coupled to receive the voltage control signal;

a first SPDT output electrically coupled to the second input of the dual-mode AVGA;

a second SPDT output electrically coupled to the first input of the power detector;

a third SPDT output electrically coupled to the first input of the power detector;

a fourth SPDT input electrically coupled to the second input of the dual-mode AVGA;

a first switch that switches the first SPDT input between the first SPDT output and the second SPDT output; and a second switch that switches the second SPDT input between the third SPDT output and the fourth SPDT output, wherein the dual SPDT is configured such that the first switch connects the first SPDT input to the first SPDT output and the second switch connects the second SPDT input to the third SPDT output in response to the mode signal having the first value, and wherein the dual SPDT is configured such that the first switch connects the first SPDT input to the second SPDT output and the second switch connects the second SPDT input to the fourth SPDT output in response to the mode signal having the second value.

17. The method of claim 10, wherein the dual-mode AVGA has a first control mode for determining the attenuation value when the mode signal has the first value, the first control mode having a positive control slope.

18. The method of claim 10, wherein the dual-mode AVGA has a second control mode for determining the attenuation value when the mode signal has the second value, the second control mode having a negative control slope.

19. A power amplifier for a transmitter of a communication system, the power amplifier comprising:

a radio frequency (RF) signal path including:
    a signal source configured to generate an RF signal;
    a dual-mode analog variable gain attenuator (AVGA) electrically coupled to receive (i) the RF signal, (ii) an attenuation control signal, and (iii) a mode signal, the dual-mode AVGA being configured to attenuate the RF signal based on an attenuation value indicated by the attenuation control signal, the mode signal indicating a control mode to be used by the dual-mode AVGA to determine the attenuation value based on the attenuation control signal; and
    an RF directional coupler electrically coupled to receive the RF signal from the dual-mode AVGA and to output an output RF signal and a coupled RF signal based on, the coupled RF signal being indicative of the output RF; and a power control circuit including:
    a square law power detector electrically coupled to receive (i) the coupled RF signal and (ii) a setpoint voltage signal and to generate a detector output signal based on the coupled RF signal and the setpoint voltage signal; and
    a switch circuit electrically coupled to receive (i) the mode control signal, (ii) the detector output signal, and (iii) a voltage control signal, wherein the mode signal has one of a first value indicating an open-loop automatic gain control (AGC) mode of operation for the power control circuit and a second value indicating an automatic level control (ALC) mode of operation for the power control circuit, wherein, when the power control circuit is operated in the AGC mode, the voltage control signal corresponds to an AGC control voltage, wherein, when the power control circuit is operated in the ALC mode, the voltage control signal corresponds to an ALC reference voltage, wherein, in response to the mode control signal having the first value, the switch circuit supplies the AGC control voltage to the dual-mode AVGA as the attenuation control signal, wherein, in response to the mode control signal having the second value, the switching circuit supplies the ALC reference voltage to the square law power detector as the setpoint voltage signal and supplies the detector output signal to the dual-mode AVGA as the attenuation control signal, and wherein, when the setpoint voltage signal corresponds to the ALC reference voltage, the square law power detector is configured to generate the detector output signal such that the detector output signal has a voltage indicative of the attenuation value required to bring the output RF signal in line with the ALC reference voltage.

20. The power amplifier of claim 19, wherein, in response to the mode control signal having the first value, the switch circuit supplies the detector output signal to the power detector as the setpoint voltage signal, and wherein, when the setpoint voltage signal corresponds to the detector output signal, the square law power detector is in a measurement mode, such that the detector output signal having a voltage level that is linear-in-dB proportional to a voltage level of the coupled RF signal.

* * * * *